United States Patent [19]
Dimitri et al.

[11] Patent Number: 4,882,583
[45] Date of Patent: Nov. 21, 1989

[54] MODIFIED SLIDING BLOCK CODE FOR LIMITING ERROR PROPAGATION

[75] Inventors: Kamal E. Dimitri, Tucson, Ariz.; Martin A. Hassner, Palo Alto; Paul H. Siegel, San Jose, Calif.

[73] Assignee: International Business Machines Corporation, Armonk, N.Y.

[21] Appl. No.: 200,322

[22] Filed: May 31, 1988

[51] Int. Cl.$^4$ .............................................. H03M 7/00
[52] U.S. Cl. ......................................... 341/59; 360/39
[58] Field of Search ................ 341/50, 55, 59; 360/39

[56] References Cited

U.S. PATENT DOCUMENTS

| | | | |
|---|---|---|---|
| 3,689,899 | 9/1972 | Franaszek | 340/172.5 |
| 4,115,768 | 9/1978 | Eggenberger et al. | 340/347 |
| 4,146,909 | 3/1979 | Beckenhauer et al. | 360/39 |
| 4,413,251 | 11/1983 | Adler et al. | 340/347 |
| 4,463,344 | 7/1984 | Adler et al. | 340/347 |
| 4,488,142 | 12/1984 | Franaszek | 340/347 |
| 4,502,036 | 2/1985 | Furukawa | 340/347 |
| 4,567,464 | 1/1986 | Siegel et al. | 340/347 |
| 4,833,470 | 5/1989 | Iketani | 341/59 |

OTHER PUBLICATIONS

Adler et al.; "Algorithms for Sliding Block Codes,"
IEEE Trans. on Info. Theory; IT-29, No. 1, Jan., 1983, pp. 5-22.
Rissanen et al.; "Arithmetic Coding"; IBM Journal of Research and Development; Vol. 23, No. 2, March, 1979, pp. 149-161.
Guazzo; "A General Minimum-Redundancy Source--Coding Algorithm", IEEE Trans. Info. Theory, IT-26, No. 1, Jan., 1980, pp. 15-25.
Franaszek; "Sequence State Methods for Run-Length Limited Coding", RC-2600, (IBM Internal Report); Aug. 28, 1969; Also published in IBM Journal of Research and Development; July, 1970; pp. 376-383.

Primary Examiner—William M. Shoop, Jr.
Assistant Examiner—Marc S. Hoff
Attorney, Agent, or Firm—H. F. Somermeyer

[57] ABSTRACT

Uncompressed data is represented in a constrained code for transmission through a channel which may include record media. A d,k code having a code rate of m/n is employed. "d" represents the minimum number of successive zeros in the channel code while k represents the maximum number of zeros in the channel code. "n" is an integer representing the number of code bits in a channel group. The encoding and decoding follows a sliding block coding and decoding algorithm. In the channel coding, the number of successive ones is limited to being not less than two, in some coding it can be a value of $d-1$. The modification of the d,k code results in decreasing error propagation while increasing the recorded information density. This increase is achieved by increasing the channel code dictionary.

6 Claims, 3 Drawing Sheets

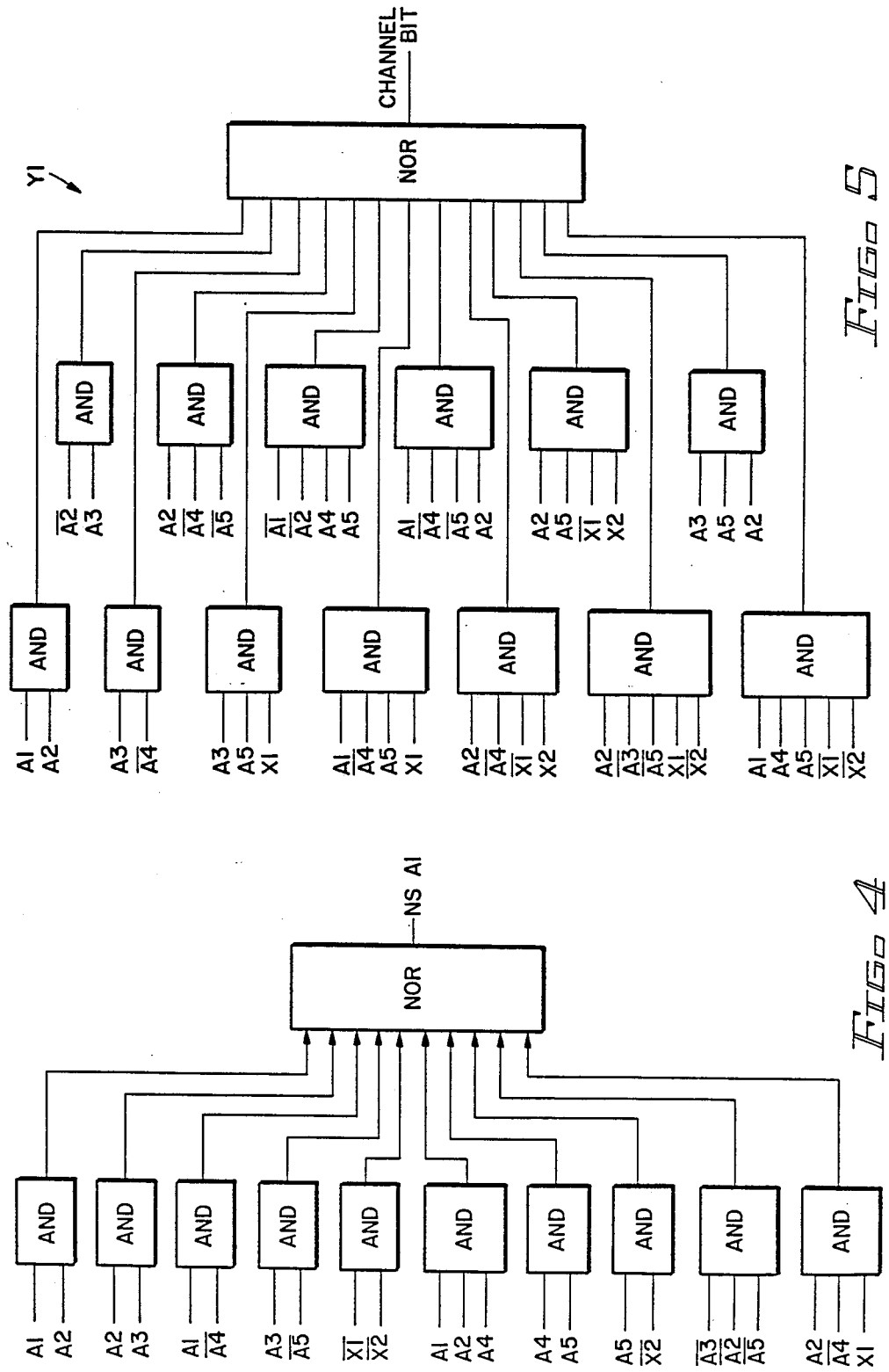

MODIFIED SLIDING BLOCK CODE FOR LIMITING ERROR PROPAGATION

DOCUMENTS INCORPORATED BY REFERENCE

U.S. Pat. No. 4,567,464, Siegel et al.; U.S. Pat. No. 4,115,768, Eggenberger et al; U.S. Pat. No. 4,146,909, Beckenhauer et al.; U.S. Pat. No. 4,413,251, Adler et al.; U.S. Pat. No. 4,463,344, Adler et al.; U.S. Pat. No. 4,488,142, Franaszek; U.S. Pat. No. 3,689,899, Franaszek; U.S. Pat. No. 4,502,036, Furukawa; *IEEE Transactions on Information Theory*, IT-29, No. 1, Jan. 1983, pages 5-22, Adler et al.; *IBM Journal of Research and Development*, "Arithmetic Coding", Rissanen et al.; *IEEE Transactions of Information Theory*, IT-26, No. 1, Jan. 1980, pages 15-25, Guazzo; *IBM Journal of Research and Development.*

FIELD OF THE INVENTION

The present invention relates to data encoding, particularly data encoding for use in recording devices.

BACKGROUND OF THE INVENTION

Various apparatus and methods had been proposed in the past for increasing the effective recorded data density on various record media, such as magnetic disks, tapes and optical record media. One accepted approach is known as run-length-limited encoding (RLL) which requires that each binary one (which represents a first signal or record state) in a coded bit sequence be separated from the next occurring binary one by a bounded number of intervening zeros. The number of intervening zeros is equal to a minimum quantity called d and cannot exceed a maximum number of zeros k. Quantity d is to limit inter-symbol interference while the quantity k enables a readback clock to be derived from recorded or transmitted signals. Codes for recording media and communications using this general arrangement are referred to as (d,k) run-length-limited codes. Such codes convert unconstrained data into a (d,k) constrained channel set of signals. Generally, such codes are encoded from m unconstrained bits which are mapped into n constrained bits, where m is less than n. The ratio m/n is referred to as the coding rate. It is obviously desirable to maximize this rate. Information density is defined as (m/n)(d+1).

Increasing the coding rate occurs at the expense of look ahead resulting in increasing error propagation within the channel encoded bits or groups. For example, a single-bit error introduced into the encoded channel code stream can result in a predetermined number of subsequent bits (unconstrained bits) being also erroneous before the encoding algorithm enables the channel code bits to be self-correcting.

The Franaszek, U.S. Pat. No. 3,689,899, discloses two d,k codes which are 1,8 and 2,7. These codes are variable-length fixed-rate state-independent block codes. The coding rate of the 1,8 code was set to be ⅔ with a code dictionary of sixteen code words having lengths varying from three to nine channel bits, all in multiples of three channel bits. The Franaszek 2,7 code has a coding rate of ½ with a dictionary of seven channel words varying in length from two channel bits to eight channel bits in multiples of two channel bits. Another reference showing a 1,7 code is "Efficient Code for Digital Magnetic Recording", by Franaszek in the *IBM Technical Disclosure Bulletin*, Vol. 23, No. 9, Feb. 1981 on page 4375. This reference teaches a bounded delay code. The article "An Optimization of Modulation Codes in Digital Recording", by Horiguchi et al., *IEEE Transactions on Magnetics*, Vol. MEG-12, No. 6, Nov. 1976, page 740, discloses another d,k code.

The Eggenberger et al., U.S. Pat. No. 4,115,768, avoids the grouping requirement of the Franaszek codes. This patent shows a 2,7 d,k code which avoids the framing requirements. The information density of the 1,7 and 2,7 d,k codes are respectively 1.3 and 1.5. If a 3,7 code is employed, then an information density of 1.6 is found while a 4,20 code results in an information density value of 2.0.

SUMMARY OF THE INVENTION

It is an object of the present invention to provide an enhanced d,k code apparatus and method preferably including a recorded medium, having a higher information density yet exhibiting a shorter error propagation than prior d,k codes.

In accordance with the invention, a d,k code is modified such that each of the singleton binary ones in the channel encoded signals is made into a string of j binary ones where j is two or greater. Immediately adjacent binary zeros to the singleton binary one are reversed in sign to become binary ones. This change violates the minimum d value where ever a singleton one occurs within a d,k code. This substitution limits error propagation. All other predetermined characteristics of the d,k code may be maintained.

The foregoing and other objects, features, and advantages of the invention will be apparent from the following more particular description of preferred embodiments of the invention, as illustrated in the accompanying drawings.

DESCRIPTION OF THE DRAWING

FIGS. 4 and 5 are abbreviated showings of logic circuits useable in the FIG. 2 illustrated encoder.

DETAILED DESCRIPTION OF THE DRAWING

Figure 1:
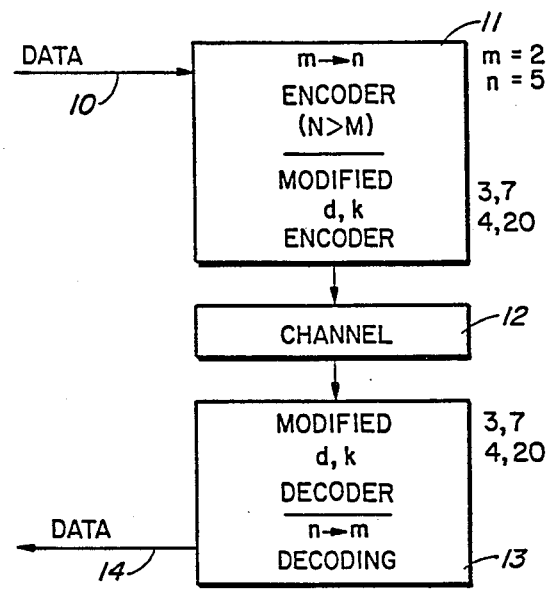
FIG. 1 is a general block diagram of a data transfer system employing the present invention.

Referring now more particularly to the drawing, like numerals indicate like parts and structural features in the various figures. In FIG. 1 unconstrained data is received over line 10 in the illustrated embodiment. The unconstrained data is received two bits at a time. The m/n encoder 11 encodes each of the two-bit unconstrained data bits into a code of five channel bits giving a rate of 2 to 5. A part of the encoder 11 is a modified d,k encoder illustrated in the present application for encoding into a 3,7 or a 4,20 d,k channel code format. A usual 3,7 d,k encoder results in a dictionary of six channel code groups of five bits each, but in modifying the d,k encoder, the dictionary is expanded to ten channel code groups. The output signals of encoder 11 travel through a channel 12 which may include a record medium. The channel outputs its signals either during a media readback or from a communication channel to a modified d,k decoder which includes an n to m decoding translation by decoder 13. Decoder 13 outputs two bits at a time of the unconstrained data over line 14.

Figure 2:
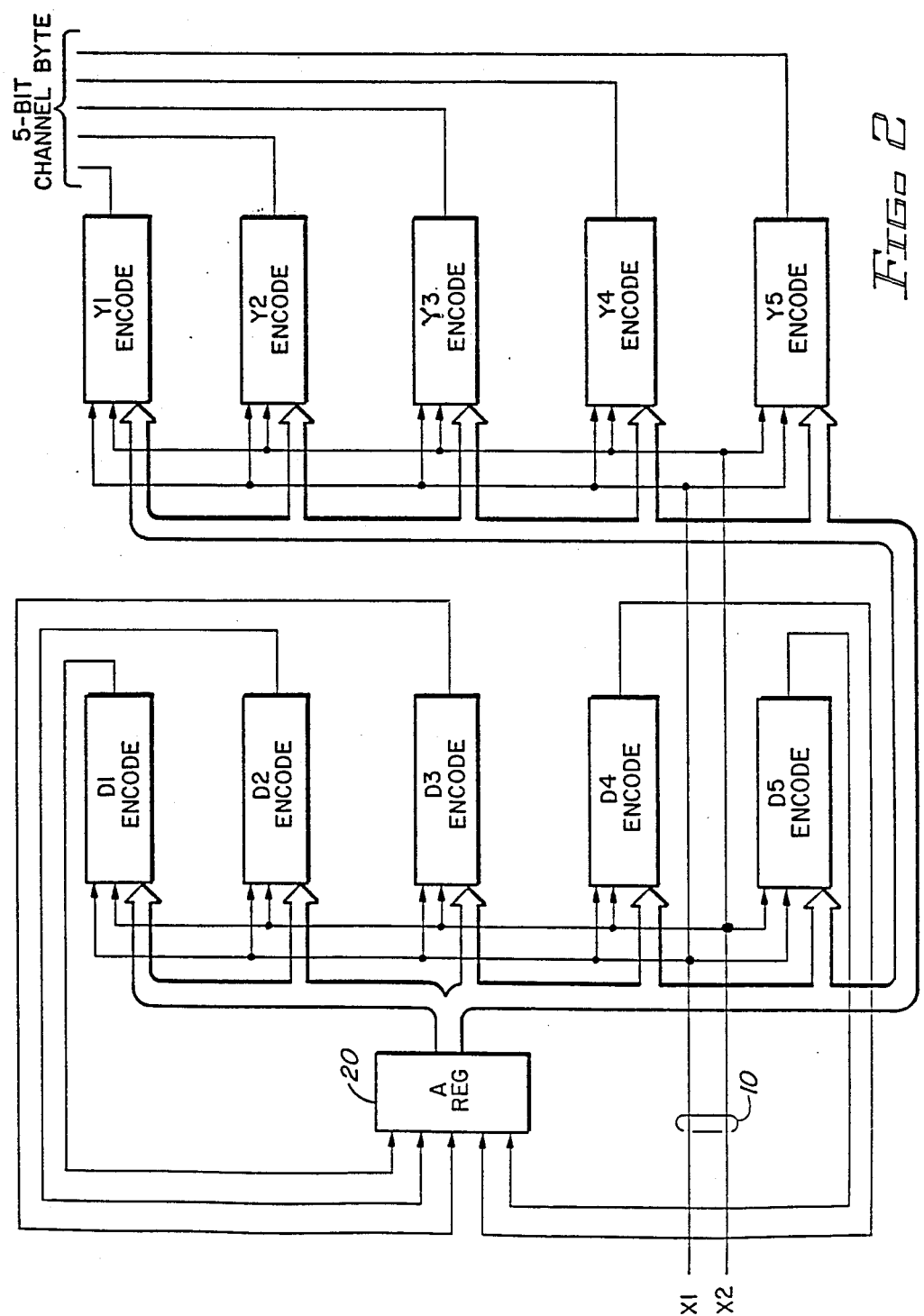
FIG. 2 is a block diagram of an encoder implementing the present invention.

The encoder 11 and decoder 13 combine the logic of m to n encoding and decoding with the modified d,k encoding and decoding. The encoder 11 is best seen in FIG. 2. The two input data bits X1 and X2 are received over the pair of lines 10. In FIG. 2 encoder is constructed as a sequential state machine. Encoder elements D1-D5 encode the machine states as will be later described. The encoded machine states are then stored in register AREG 20. AREG 20 outputs the current machine state to all of the encoders D1-D5 for generating the ensuing machine states. Each cycle of the sequential state machine combines the input data X1,X2 with the current machine state as stored in AREG 20. The five-bit channel byte or group is generated in the encoders Y1-Y5. The two input unconstrained data bits X1,X2 are applied to all of the encoders Y1-Y5 and mixed therein with the output of AREG 20 to produce a sliding block output set of channel bits for each of the two input X1,X2 unconstrained data bits.

Table 1 below shows the state transitions for the FIG. 2 illustrated encoder when encoding a modified 3,7 d,k code.

TABLE 1

ENCODING STATE TRANSITIONS (3,7,m)

| | DATA INPUT | | | |
|---|---|---|---|---|
| CS | 00 NS/output | 01 NS/output | 10 NS/output | 11 NS/output |
| 1 | 4/10011 | 5/10011 | 6/10011 | 7/10011 |
| 2 | 1/10001 | 8/10000 | 16/10000 | 17/10000 |
| 3 | 2/10001 | 3/10001 | 15/10000 | 7/10000 |
| 4 | 4/00011 | 5/00011 | 6/00011 | 7/00011 |
| 5 | 5/00000 | 16/00000 | 19/00000 | 20/00000 |
| 6 | 4/00110 | 2/00001 | 3/00001 | 1/00001 |
| 7 | 6/00110 | 7/00110 | 8/00110 | 9/00110 |
| 8 | 4/01100 | 10/01100 | 11/01100 | 12/01100 |
| 9 | 17/00000 | 13/01100 | 14/01100 | 7/01100 |
| 10 | 1/11001 | 1/00001 | 2/11001 | 3/11001 |
| 11 | 7/11000 | 2/00001 | 3/00001 | 15/11000 |
| 12 | 4/11000 | 8/11000 | 16/11000 | 17/11000 |
| 13 | 4/00110 | 10/01100 | 11/01100 | 12/01100 |
| 14 | 4/01100 | 13/01100 | 14/01100 | 7/01100 |
| 15 | 1/11001 | 4/00110 | 2/11001 | 3/11001 |
| 16 | 4/11000 | 13/01100 | 14/01100 | 7/01100 |
| 17 | 7/11000 | 8/11000 | 16/11000 | 15/11000 |
| 18 | 1/11001 | 10/01100 | 11/01100 | 12/01100 |
| 19 | 7/11000 | 15/11000 | 2/11001 | 3/11001 |
| 20 | 4/01100 | 8/11000 | 16/11000 | 17/11000 |

The current state CS represents the numerical contents of AREG 20. The next state, NS, in each of the four columns represents the next state signals as supplied by the encoders D1-D5 to AREG 20 to be used in the ensuing encoding cycle. The output channel byte is represented in binary form in each of the four columns. The machine operation varies with the two-bit unconstrained data input as indicated in the columns headed by 00, 01, 10 and 11 respectively. As an example, when the current state is 1 with the data input of 01, then the next state is 5 with an output byte Y1-Y5 of 10011. The modification of the 3,7 d,k code is readily ascertained from the state transition Table 1. Wherever two zeros occur in a row, they are always adjacent to binary ones. One of those binary ones is the binary one substituted for a binary zero to get a doublet of binary ones rather than a singleton binary one. For example, in current state one, the leading binary zero (left-most zero) is one of such added binary ones. That is, all transitions from any of the other states to state one has a binary one in the trailing or right-most position. For example, in state six with a data input of 11, the next state is state one. It should be noted that the numerical contents of the output byte from state six is 00001, resulting normally in a 3,7 encoding of a singleton one. In state one, all of the possible output bits have a left-most binary one which is the substituted binary one for the normal reoccurring binary zero in such code groups. Examination of the state transition table for the 3,7 code will find other examples of modifications to a normal 3,7 d,k code wherein singleton binary ones were converted to a doublet of binary ones in accordance with the present invention.

Relating Table 1 to FIG. 2, the current state CS is the numerical contents of AREG 20. The value NS of the state transition table corresponds to the output signals of the encoders D1-D5 for generating the next successive numerical contents of AREG 20. The output values shown in binary form represent the five-bit channel bits of FIG. 2. In a constructed embodiment, the decimal indicated numbers for the machine states are binary encoded. In one embodiment binary encoded numbers for states one through twenty were one less than the decimal notation; five bits of binary zeros represented by machine state one. State two is represented by a binary one preceded by four zeros, and so forth.

The FIG. 2 illustrated encoder can be implemented in solid state logic such as in an integrated circuit chip, programmable logic array, microcode and other forms of technology useful for manipulating digital signals. The construction of the electronics or optics is in accordance with the numerical values set forth in the state transition Table 1 for the 3,7 code. It should be noted that the substituted extra one to create a doublet of binary ones will always be to the right of a singleton binary one in Table 1 shown above. The binary one can be inserted in an advance or preceding position as well. The modification of a 3,7 code is by mapping into the 3,7 code from a channel code combination of 010 to 011.

The ten five-bit code groups making up the dictionary of the illustrated modified 3,7 code are 10011, 10001, 10000, 00011, 00000, 00110, 01100, 11001, 11000 and 00001.

Figure 3:
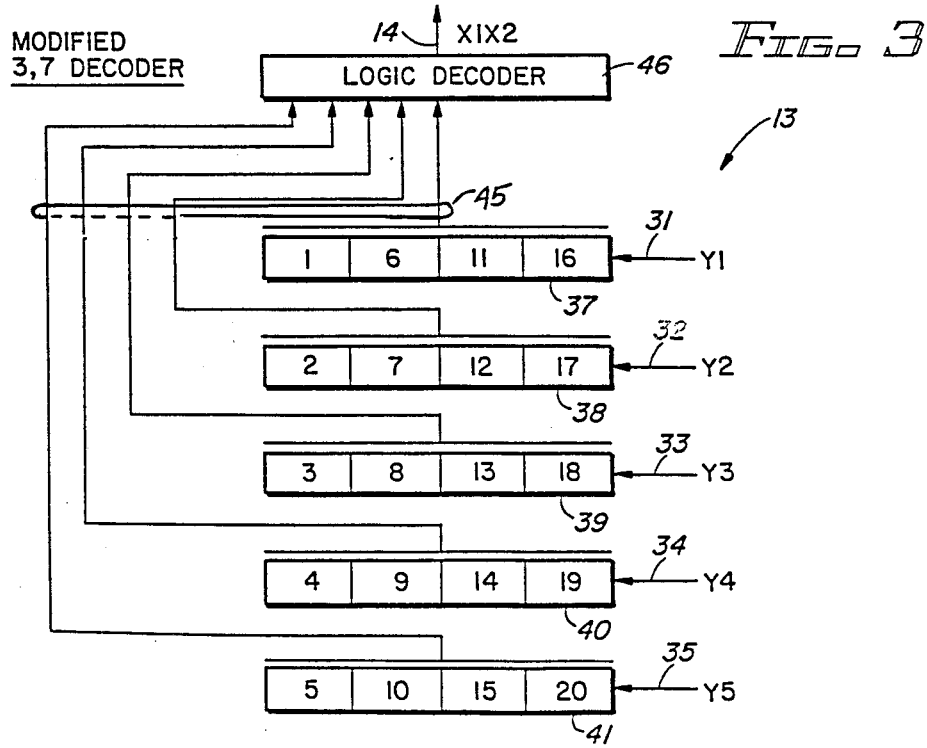
FIG. 3 is a block diagram of a decoder implementing the present invention.

A decoder for the encoded channel bits is shown in FIG. 3. Lines 31-35 inclusive, respectively, carry the channel bits generated respectfully by the encoders Y1-Y5 of FIG. 2. A set of four-bit shift registers 37, 38, 39, 40, 41 respectively received the lines 31-35 signals. During each cycle of the decoding, the bits in each of the shift registers 37-41 are shifted once to the left. All four groups of each of the shift registers have supplied respectively over a set of lines collectively enumerated 45 to a logic decoder 46. Decoder 46 generates the output signals X1 and X2 on the dual line 14. Construction of the logic decoder 46 is set forth in Table 2 below. The channel code group bit patterns are denominated in decimal. A blank in any column signifies a "don't care" value. Columns S signify the suffix group and P signifies the postfix group for the decode groups, respectively.

Figure 6:
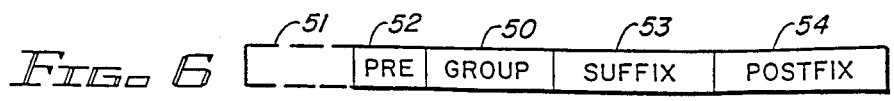
FIG. 6 is a block diagram showing the representation of unconstrained data in the constrained encoding.

The representation of unconstrained data in the constrained encoding is shown in FIG. 6. The group 50 represents the output of the Y1-Y5 encoders for the currently received input unconstrained data bits received over line 10. The interpretation of that channel group or bit is somewhat effected by the immediately preceding group of bits 51. In the present embodiment, the last two bits of the preceding channel group 51, as represented by numeral 52, are used in the representation of the unconstrained data bits.

Additionally, two channel groups or bits are used in the decoding of a group 50. Such groups are respectively called the suffix S53 which is the channel bit following the group 50 and a postfix P54 which immediately follows suffix 53.

In Table 2 below, the decode of group 50 (FIG. 6), etc. are shown as subtables. The output data is shown in the left-hand column in binary form. The numerical contents of the group 50 is a subheading in Table 2, such as group 19, group 17, etc. In the column S, are the decimal representation of the contents of a suffix 53 used in decoding the data. Column P has a postfix 54 contents represented in decimal notation. For example, in group 19 the line having S=6 and P=6 results in a decode of data 11 for a group 50 having a value 19. All of the remaining decoding is the same except at the end where the prefix decoding is shown by decode in accordance with the prefix value wherein the number X indicates a don't care value. For example, in the grouping decode X1, only the right-most bit of the group 51 is used as a prefix. Column G contains a value of group 50, column S the value of suffix 53 and the column P the value of postfix 54 all in decimal notation. Further in decode X10, the prefix is 10 with the X indicating the three left-most or preceding bits of group 51 are don't cares.

TABLE 2

DECODE TRUTH TABLE (3,7,m)

| DATA (BINARY) | S | P | DATA (BINARY) | S | P |
|---|---|---|---|---|---|
| DECODE GROUP = 19 DECIMAL | | | DECODE GROUP = 17 DECIMAL | | |
| 00 | 3 | | 00 | 19 | |
| 01 | 0 | | 00 | 17 | 19 |
| 10 | 1 | | 00 | 16 | 12 |
| 10 | 6 | 3 | 00 | 16 | 24 |
| 11 | 6 | 6 | 11 | 16 | 17 |
| 11 | 6 | 10 | 11 | 16 | 16 |
| 11 | 6 | 0 | 11 | 16 | 25 |
| | | | 11 | 16 | 6 |
| | | | 11 | 17 | 16 |
| DECODE GROUP = 16 DECIMAL | | | DECODE GROUP = 3 DECIMAL | | |
| 01 | 12 | 3 | 00 | 3 | |
| 01 | 12 | 25 | 01 | 0 | |
| 01 | 12 | 1 | 10 | 1 | |
| 01 | 12 | 24 | 10 | 6 | 3 |
| 10 | 12 | 6 | 11 | 6 | 6 |
| 10 | 12 | 12 | 11 | 6 | 1 |
| 10 | 12 | 3 | 11 | 6 | 12 |
| 10 | 25 | 19 | 11 | 6 | 0 |
| 10 | 6 | 3 | | | |
| 10 | 25 | 17 | DECODE GROUP = 0 DECIMAL | | |
| 10 | 25 | 16 | | | |
| 11 | 24 | 25 | 10 | 25 | 17 |
| 11 | 24 | 6 | 10 | 25 | 16 |
| 11 | 24 | 12 | 00 | 25 | 19 |
| 11 | 24 | 24 | 00 | 12 | 25 |
| 11 | 6 | 1 | 00 | 12 | 24 |
| 11 | 6 | 6 | 00 | 12 | 1 |
| 11 | 6 | 12 | 01 | 12 | 2 |
| 11 | 6 | 0 | 01 | 12 | 12 |
| | | | 01 | 12 | 3 |
| | | | 01 | 24 | 3 |
| | | | 10 | 24 | 6 |
| DECODE GROUP = 12 DECIMAL | | | DECODE GROUP = 25 DECIMAL | | |
| 00 | 3 | | 00 | 19 | |
| 01 | 25 | | 10 | 17 | 19 |
| 01 | 1 | 17 | 11 | 17 | 17 |
| 10 | 1 | 17 | 11 | 17 | 16 |
| 10 | 1 | 16 | 11 | 16 | 6 |
| 10 | 24 | 6 | 10 | 16 | 24 |
| 10 | 24 | 25 | 10 | 16 | 12 |
| 11 | 24 | 12 | | | |
| 11 | 24 | 24 | | | |
| 11 | 24 | 3 | | | |
| 01 | 6 | 3 | | | |
| 11 | 6 | 6 | | | |
| 11 | 6 | 1 | | | |
| 11 | 6 | 12 | | | |
| 11 | 6 | 0 | | | |
| 01 | 12 | 25 | | | |
| 01 | 12 | 1 | | | |
| 01 | 12 | 24 | | | |
| 10 | 12 | 3 | | | |
| 10 | 12 | 6 | | | |
| 10 | 12 | 12 | | | |
| DECODE GROUP = 24 DECIMAL | | | DECODE GROUP = 1 DECIMAL | | |
| 00 | 6 | 6 | 01 | 16 | 24 |
| 00 | 6 | 1 | 01 | 16 | 12 |
| 00 | 6 | 12 | 01 | 17 | 19 |
| 00 | 6 | 0 | 10 | 17 | 17 |
| 11 | 25 | 19 | 10 | 17 | 16 |
| 11 | 25 | 17 | 10 | 16 | 25 |
| 11 | 25 | 16 | 10 | 16 | 6 |
| 00 | 3 | 3 | | | |
| 00 | 3 | 0 | DECODE GROUP = 6 DECIMAL | | |
| 00 | 3 | 6 | | | |
| 00 | 3 | 1 | 00 | 3 | |
| | | | 00 | 1 | |
| | | | 10 | 12 | |
| | | | 00 | 12 | 3 |
| | | | 01 | 6 | 6 |
| | | | 01 | 6 | 1 |
| | | | 01 | 6 | 12 |

DECODING USING PREFIXES IN CONSTRAINED CHANNEL

| DATA | G | S | P | DATA | G | S | P |
|---|---|---|---|---|---|---|---|
| DECODE PREFIX X1 | | | | DECODE PREFIX X0 | | | |
| 11 | 0 | 24 | 12 | 00 | 24 | 12 | |
| 11 | 0 | 24 | 24 | 00 | 24 | 24 | |
| 11 | 0 | 24 | 25 | 00 | 24 | 25 | |
| DECODE PREFIX X10 | | | | DECODE PREFIX X00 | | | |
| 11 | 24 | 6 | 3 | 01 | 24 | 6 | 3 |
| 11 | 1 | 19 | 3 | 01 | 1 | 19 | 3 |
| 11 | 1 | 19 | 0 | 01 | 1 | 19 | 0 |
| 11 | 1 | 19 | 1 | 01 | 1 | 19 | 1 |
| 11 | 1 | 19 | 6 | 01 | 1 | 19 | 6 |
| DECODE PREFIX X11 | | | | | | | |
| 11 | 1 | 19 | 3 | | | | |
| 11 | 1 | 19 | 0 | | | | |
| 11 | 1 | 19 | 1 | | | | |
| 11 | 1 | 19 | 6 | | | | |

FIG. 4 illustrates the logic circuit used in encoder D1 for setting the next state A1 of AREG 20. The inputs on the left side of the figure correspond to the values contained in the AREG five stages or bit positions A1 through A5 with the data inputs X1 and X2. A bar above the alphanumeric notation indicates negation condition whereas the alphanumeric notation without a bar indicates "as written." Since the logic is self-explanatory, it is not further described. The other encoders D2 through D5 are similarly constructed using the information contained in the table for the state transitions. Of course, logic simplification can be employed. FIG. 5 indicates the operation of a decoder Y1 using the same notation as set forth in FIG. 4. The encoders Y2 through Y5 are similarly constructed. Also, the decoders in the decode logic broken up on a bit-by-bit basis are shown for the encoder with the logic of operation being derived from the decoding tables set forth above. In relating FIG. 3 to the decode Table 1, the decoder logic 46 receives inputs from all of the bit positions in all of the shift registers. Four channel bit groups are in the shift register at each given time for decoding. In the Table 2 indicated decode groups the bits in the left-most three positions are used in the decoding while the numerical contents of the fourth position are ignored. For example, bits 1, 2, 3, 4, 5 correspond to the first received channel byte; 6–10 to the second; 11–15 to the third; and 16–20 to the fourth received channel byte. These channel bytes are serially shifted through the shift registers. In decoding group 19 of Table 2, the numerical value 19 is in bit positions 1–5; the suffix group S is in bit positions 6–10 the postfix group P is in bit positions 11–15. The same relationship follows for all of the decode groups. The prefix decoding finds the prefix either in bit 5 or in bits 4 and 5 depending on whether there are one or two prefix bits. The group byte is then in bits 6–10, the suffix S in bits 11–15, while the postfix P is in bits 16–20. It is the decoding of all of the bit positions that determines whether or not a prefix is being decoded or a group is being decoded as set forth in the Table 2. The logic of the decoder 46 is in accordance with the Table 2 presentation.

The present invention can be applied to d,k codes other than 3,7. A higher information density d,k code is the 4,20 recording code. Table 3 shows a modified 4,20 encode dictionary constructed in accordance with the present invention.

TABLE 3

CHANNEL GROUP VALUES FOR A 4,20 MODIFIED d,k CODE

| BINARY | DECIMAL |
|---|---|
| 00000 | 0 |
| 00001 | 1 |
| 00011 | 3 |
| 00111 | 7 |
| 01110 | 14 |
| 10000 | 16 |
| 10001 | 17 |
| 10011 | 19 |
| 11000 | 24 |
| 11001 | 25 |
| 11100 | 28 |

Table 4 shows the encoding state transition table in decimal notation for the 4,20 modified d,k code.

TABLE 4

ENCODE TABLE FOR (4,20 MODIFIED d,k CODE) DATA INPUT

| CS | 00 NS/Out | 01 NS/Out | 10 NS/Out | 11 NS/Out |
|---|---|---|---|---|
| 1 | 11/19 | 14/24 | 15/24 | 16/24 |
| 2 | 1/25 | 2/25 | 3/25 | 8/24 |
| 3 | 18/24 | 19/24 | 9/24 | 10/24 |
| 4 | 4/19 | 5/19 | 6/19 | 7/19 |
| 5 | 11/16 | 14/16 | 15/16 | 16/16 |
| 6 | 1/17 | 2/17 | 3/17 | 8/16 |
| 7 | 18/16 | 19/16 | 9/16 | 10/16 |
| 8 | 4/3 | 5/3 | 6/3 | 7/3 |
| 9 | 1/1 | 2/1 | 3/1 | 8/7 |
| 10 | 9/7 | 10/7 | 17/7 | 20/7 |
| 11 | 11/14 | 17/14 | 12/14 | 13/14 |
| 12 | 8/0 | 9/14 | 10/14 | 8/14 |
| 13 | 20/0 | 9/0 | 10/0 | 17/0 |
| 14 | 11/28 | 14/28 | 15/28 | 16/28 |
| 15 | 8/14 | 9/14 | 10/14 | 8/14 |
| 16 | 17/28 | 10/28 | 9/28 | 20/28 |
| 17 | 14/0 | 16/0 | 15/0 | 11/0 |
| 18 | 14/0 | 21/0 | 22/0 | 17/0 |
| 19 | 8/0 | 9/0 | 10/0 | 11/0 |
| 20 | 8/0 | 9/0 | 10/0 | 17/0 |
| 21 | 8/0 | 10/28 | 9/28 | 8/28 |

TABLE 4-continued

ENCODE TABLE FOR (4,20 MODIFIED d,k CODE) DATA INPUT

| CS | 00 NS/Out | 01 NS/Out | 10 NS/Out | 11 NS/Out |
|---|---|---|---|---|
| 22 | 17/28 | 9/0 | 10/0 | 20/28 |

The arrangement of Table 4 is the same as used in Table 1. Table 5 shows the decode in decimal notation with the binary data output in the left-hand column, the decode groups being headers for the various subportions of the tables, the S column being the suffix column and the P column being the postfix column.

TABLE 5

4,20 MODIFIED d,k CODE DECODING TRUTH TABLE

| DATA | S | P |
|---|---|---|
| DECODE GROUP 24 | | |
| 00 | 14 | 14 |
| 00 | 14 | 0 |
| 10 | 14 | 3 |
| 10 | 14 | 1 |
| 10 | 14 | 7 |
| 00 | 0 | 28 |
| 00 | 0 | 0 |
| 01 | 0 | 3 |
| 01 | 0 | 1 |
| 01 | 0 | 7 |
| 01 | 0 | 14 |
| 10 | 1 | 24 |
| 10 | 1 | 25 |
| 11 | 3 | 19 |
| 11 | 3 | 16 |
| 11 | 3 | 17 |
| 10 | 7 | 3 |
| 11 | 7 | 1 |
| 11 | 7 | 7 |
| 11 | 7 | 0 |
| 01 | 28 | 14 |
| 01 | 28 | 28 |
| 10 | 28 | 3 |
| 11 | 28 | 1 |
| 11 | 28 | 7 |
| 11 | 28 | 0 |
| DECODE GROUP 25 | | |
| 00 | 24 | 14 |
| 00 | 24 | 28 |
| 01 | 24 | 3 |
| 10 | 24 | 0 |
| 10 | 24 | 1 |
| 10 | 24 | 7 |
| 01 | 25 | 24 |
| 01 | 25 | 25 |
| DECODE GROUP 19 | | |
| 00 | 19 | 19 |
| 00 | 19 | 16 |
| 00 | 19 | 17 |
| 01 | 16 | 14 |
| 01 | 16 | 28 |
| 11 | 16 | 0 |
| 11 | 16 | 1 |
| 11 | 16 | 7 |
| 10 | 17 | 24 |
| 10 | 17 | 25 |
| 10 | 17 | 3 |
| DECODE GROUP 16 | | |
| 00 | 0 | 28 |
| 00 | 0 | 0 |
| 01 | 0 | 3 |
| 01 | 0 | 1 |
| 01 | 0 | 7 |
| 01 | 0 | 14 |
| 00 | 14 | 14 |
| 00 | 14 | 0 |
| 10 | 14 | 3 |
| 10 | 14 | 1 |
| 10 | 14 | 7 |
| 10 | 1 | 24 |

TABLE 5-continued 4,20 MODIFIED d,k CODE DECODING TRUTH TABLE

| | | |
|---|---|---|
| 10 | 1 | 25 |
| 11 | 3 | 19 |
| 11 | 3 | 16 |
| 11 | 3 | 17 |
| 10 | 7 | 3 |
| 11 | 7 | 1 |
| 11 | 7 | 7 |
| 11 | 7 | 0 |
| 01 | 28 | 14 |
| 01 | 28 | 28 |
| 10 | 28 | 3 |
| 11 | 28 | 1 |
| 11 | 28 | 7 |
| 11 | 28 | 0 |
| DECODE GROUP 17 | | |
| 00 | 24 | 14 |
| 00 | 24 | 28 |
| 10 | 24 | 0 |
| 10 | 24 | 1 |
| 10 | 24 | 7 |
| 01 | 25 | 24 |
| 01 | 25 | 25 |
| 01 | 25 | 3 |
| DECODE GROUP 1 | | |
| 00 | 24 | 14 |
| 00 | 24 | 28 |
| 10 | 24 | 0 |
| 10 | 24 | 1 |
| 10 | 24 | 7 |
| 01 | 25 | 24 |
| 01 | 25 | 25 |
| 01 | 25 | 3 |
| DECODE GROUP 0 | | |
| 00 | 0 | 3 |
| 00 | 0 | 1 |
| 00 | 0 | 7 |
| 00 | 0 | 0 |
| 01 | 0 | 3 |
| 10 | 0 | 1 |
| 10 | 0 | 7 |
| 11 | 0 | 14 |
| 11 | 0 | 28 |
| 01 | 1 | 24 |
| 01 | 1 | 25 |
| 00 | 3 | 19 |
| 00 | 3 | 16 |
| 00 | 3 | 17 |
| 01 | 7 | 3 |
| 10 | 7 | 1 |
| 10 | 7 | 7 |
| 10 | 7 | 0 |
| 10 | 14 | 3 |
| 10 | 14 | 1 |
| 10 | 14 | 7 |
| 11 | 14 | 14 |
| 11 | 14 | 0 |
| 11 | 14 | 3 |
| 00 | 28 | 14 |
| 00 | 28 | 28 |
| 01 | 28 | 1 |
| 01 | 28 | 7 |
| 01 | 28 | 0 |

| DATA | G | S | P |
|---|---|---|---|
| PREFIX: 24,16 | | | |
| 01 | 0 | 28 | 3 |
| PREFIX: 28, 0, 7, 14 | | | |
| 10 | 0 | 28 | 3 |

| DATA | S | P |
|---|---|---|
| DECODE GROUP 28 | | |
| 00 | 0 | 14 |
| 00 | 0 | 28 |
| 11 | 0 | 3 |
| 11 | 0 | 1 |
| 11 | 0 | 7 |
| 11 | 0 | 0 |
| 11 | 3 | 16 |
| 11 | 3 | 17 |

TABLE 5-continued 4,20 MODIFIED d,k CODE DECODING TRUTH TABLE

| | | |
|---|---|---|
| 11 | 3 | 19 |
| 01 | 7 | 1 |
| 01 | 7 | 7 |
| 01 | 7 | 0 |
| 10 | 7 | 3 |
| 00 | 14 | 0 |
| 00 | 14 | 14 |
| 10 | 14 | 3 |
| 10 | 14 | 1 |
| 10 | 14 | 7 |
| 01 | 28 | 14 |
| 01 | 28 | 28 |
| 10 | 28 | 3 |
| DECODE GROUP 3 | | |
| 01 | 16 | 14 |
| 01 | 16 | 28 |
| 11 | 16 | 0 |
| 11 | 16 | 1 |
| 11 | 16 | 7 |
| 10 | 17 | 24 |
| 10 | 17 | 25 |
| 10 | 17 | 3 |
| 00 | 19 | 19 |
| 00 | 19 | 16 |
| 00 | 19 | 17 |
| DECODE GROUP 7 | | |
| 10 | 0 | 28 |
| 10 | 0 | 14 |
| 11 | 0 | 3 |
| 11 | 0 | 1 |
| 11 | 0 | 7 |
| 11 | 0 | 0 |
| 00 | 1 | 24 |
| 00 | 1 | 25 |
| 11 | 3 | 19 |
| 11 | 3 | 16 |
| 11 | 3 | 17 |
| 00 | 7 | 3 |
| 01 | 7 | 1 |
| 01 | 7 | 7 |
| 01 | 7 | 0 |
| DECODE GROUP 14 | | |
| 01 | 0 | 28 |
| 01 | 0 | 14 |
| 10 | 0 | 3 |
| 11 | 0 | 0 |
| 11 | 0 | 1 |
| 11 | 0 | 7 |
| 01 | 1 | 24 |
| 01 | 1 | 25 |
| 01 | 3 | 19 |
| 01 | 3 | 16 |
| 01 | 3 | 17 |
| 01 | 7 | 3 |
| 01 | 7 | 1 |
| 01 | 7 | 7 |
| 01 | 7 | 0 |
| 00 | 14 | 14 |
| 00 | 14 | 0 |
| 10 | 14 | 1 |
| 10 | 14 | 7 |
| 10 | 14 | 3 |

The decode logic 46 for a 4,20 code can be constructed using the values in Table 5.

While the invention has been particularly shown and described with reference to preferred embodiments thereof, it will be understood by those skilled in the art that various changes in form and details may be made therein without departing from the spirit and scope of the invention.

What is claimed is:

1. A code translation device for transferring data between two differently coded binary representations in respective codes thereof, being a (d,k) constrained code, a first code being unconstrained, characterized in that the "d" constraint is violated by a bit inversion adjacent each naturally coded singleton bit of the opposite denomination to reduce error propogation.

2. In a code translation device for translating code bits between a first code on a second code as set forth in claim 1, the improvement including, in combination:

said first code being an unconstrained code and said second code being a constrained code of the d,k type having a rate of m/n, zeros representing a first code state and ones representing a second code state in both said first and second codes, d and k indicating the minimum number of zeros and maximum number of zeros in a string, respectively, said d and k values giving the constrained code predetermined channel characteristics including error propagation;

a sequential state machine having first and second means to respectively operate on said first code in m bit groups and on said second code in n bit groups;

code translating means coupled to said first and second means for operating on the code groups such that a one of said m bit groups is encodable into a small number of said n bit groups in a sliding block manner, with a minimum number of ones in a string being any two ones; and error stop means in the code translating means operative to violate the d value by limiting the minimum number of ones in a string to j, where j is not less than two, by substituting a one not found in the d,k code for an adjacent zero to each of said single ones for reducing said predetermined error propagation characteristics of the constrained code while maintaining the remaining predetermined characteristics of said constrained d,k code.

3. Apparatus as set forth in claim 2, further means to said error stop means operative to limit the minimum number of successive ones to $d-1$ ones.

4. In a recording medium having a track for storing data in a series of signals wherein one state is represented by zeros and a second state is represented by ones, the improvement including, in combination:

a recorded set of strings of zeros and ones encoded as a d,k code wherein the d,k code can have a string of single-ton one and a minimum limit of d zeros in succession and a maximum of k zeros in succession, d and k being integers; and said recorded set of strings violating the d,k code in that a limit of a number of ones in any string cannot appear as less than j number of ones in succession, wherein j is an integer greater than one, and adjacent predetermined ones of said j number of ones the value d is reduced by d-j in an immediately adjacent string of successive zeros.

5. A method of coded data translation, transferring data between two differently coded binary representations thereof, one such being a (d,k) constrained code, the other code being unconstrained, characterized by the traversing of the "d" constraint by bit inversion adjacent a naturally coded singleton bit of the opposite denomination to reduce error propogation.

6. In a method of translating data between an unconstrained code and a constrained code as set forth in claim 5, the steps of:

dividing all of the unconstrained code data into m bit groups, wherein m is an integer greater than one;

dividing all of the constrained coded data into n bit groups wherein n is an integer greater than m;

representing each of the m bit groups in a plurality of said n bit groups in a sliding block manner such that the code relationship of successively handled m code groups are represented in the successive n bit groups as a sequence of bits in a d,k code wherein the d,k code rules are altered for each three bit pattern of 010 to include a doublet of adjacent ones in the three bit pattern and the d number of zeros is reduced from d to at least $d-1$; and selecting the d value to represent the minimum number of successive zeros in the n bit group and k the maximum number of successive zeros in the n bit group bit sequences.

* * * * *